US011545532B2

(12) United States Patent
Na et al.

(10) Patent No.: US 11,545,532 B2
(45) Date of Patent: Jan. 3, 2023

(54) DISPLAY DEVICE AND METHOD OF MANUFACTURING THE SAME

(71) Applicant: Samsung Display Co., Ltd., Yongin-si (KR)

(72) Inventors: Jisu Na, Yongin-si (KR); Youngjin Cho, Seoul (KR); Joong-Soo Moon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 194 days.

(21) Appl. No.: 16/875,364

(22) Filed: May 15, 2020

(65) Prior Publication Data
US 2020/0373375 A1 Nov. 26, 2020

(30) Foreign Application Priority Data

May 20, 2019 (KR) .................. 10-2019-0059067

(51) Int. Cl.
H01L 27/32 (2006.01)
H01L 51/56 (2006.01)
H01L 51/52 (2006.01)

(52) U.S. Cl.
CPC ...... *H01L 27/3276* (2013.01); *H01L 27/3246* (2013.01); *H01L 51/5237* (2013.01); *H01L 51/56* (2013.01)

(58) Field of Classification Search
CPC ............. H01L 27/3276; H01L 27/3246; H01L 51/5237
See application file for complete search history.

(56) References Cited

U.S. PATENT DOCUMENTS

| 2012/0162053 | A1 | 6/2012 | Lee et al. |
| 2017/0179212 | A1 | 6/2017 | Kwon et al. |
| 2019/0312097 | A1 | 10/2019 | Choi et al. |
| 2019/0319076 | A1* | 10/2019 | Lee ................... H01L 51/5284 |

FOREIGN PATENT DOCUMENTS

| KR | 10-1818451 | 1/2018 |
| KR | 10-2019-0013082 | 2/2019 |
| KR | 10-2019-0117866 | 10/2019 |

* cited by examiner

Primary Examiner — Fernando L Toledo
Assistant Examiner — Valerie N Newton
(74) Attorney, Agent, or Firm — H.C. Park & Associates, PLC

(57) ABSTRACT

A display device includes: in a display area, a first transistor including a first gate electrode; a second transistor electrically connected to the first transistor, including a second gate electrode; a light-emitting element; and in a peripheral area surrounding the display area, a power wiring including: first and second power wiring patterns spaced apart from each other; and a bridge pattern connecting the first and second power wiring patterns; a signal wiring; and an insulating layer covering the power wiring and the signal wiring, and a part of the insulating layer is removed to form an organic layer-removed area, the bridge pattern overlapping the organic layer-removed area, the power wiring and the signal wiring overlap each other in the organic layer-removed area, the signal wiring and the bridge pattern are disposed in a same layers as the first gate electrode and the second gate electrode, respectively.

12 Claims, 12 Drawing Sheets

DA

PA

DISPLAY DEVICE AND METHOD OF MANUFACTURING THE SAME

CROSS-REFERENCE TO RELATED APPLICATION

This application claims priority from and the benefit of Korean Patent Application No. 10-2019-0059067, filed on May 20, 2019, which is hereby incorporated by reference for all purposes as if fully set forth herein.

BACKGROUND

Field

Exemplary embodiments relate generally to a display device, more specifically, to an organic light-emitting display device and a method of manufacturing an organic light-emitting display device.

Discussion of the Background

An organic light-emitting display device is configured to emit a light for itself. Because the organic light-emitting display device can reduce its weight and thickness and has characteristics appropriate for a flexible display device, usage of the organic light-emitting display device is being increased.

The organic light-emitting display device has a display area and a peripheral area. An array of organic light-emitting diodes is disposed in the display area. A signal wiring, a power wiring or the like are disposed in the peripheral area for driving the organic light-emitting diodes.

In the organic light-emitting display device, effectively designing wiring configuration in the peripheral area reduce a non-display area and protect the organic light-emitting display device from penetration of humidity.

The above information disclosed in this Background section is only for understanding of the background of the inventive concepts, and, therefore, it may contain information that does not constitute prior art.

SUMMARY

Devices constructed according to exemplary embodiments of the invention are capable of providing a display device having improved reliability. Methods according to exemplary embodiments of the invention are capable of providing a method of manufacturing the display device.

Additional features of the inventive concepts will be set forth in the description which follows, and in part will be apparent from the description, or may be learned by practice of the inventive concepts.

According to one or more exemplary embodiments of the invention, a display device includes: a first transistor disposed in a display area, the first transistor including a first active pattern and a first gate electrode; a second transistor electrically connected to the first transistor, the second transistor including a second active pattern and a second gate electrode; a light-emitting element electrically connected to at least one of the first transistor and the second transistor; a power wiring disposed in a peripheral area surrounding the display area, the power wiring including: a first power wiring pattern; a second power wiring pattern spaced apart from the first power wiring pattern; and a bridge pattern connecting the first power wiring pattern and the second power wiring pattern; a signal wiring disposed in the peripheral area; and an insulating layer disposed covering the power wiring and the signal wiring, the insulating layer including an organic layer-removed area in which at least a part of the insulating layer is removed, wherein the bridge pattern overlapping the organic layer-removed area, wherein the power wiring and the signal wiring overlap each other in the organic layer-removed area, wherein the signal wiring is disposed in a same layer as the first gate electrode, and the bridge pattern is disposed in a same layer as the second gate electrode.

The display device may further include: a gate wiring pattern disposed on the first gate electrode.

The display device may further include: a first insulation layer covering the first active pattern; a second insulation layer covering the first gate electrode; a third insulation layer covering the gate wiring pattern; a fourth insulation layer covering the second gate electrode and the bridge pattern; and a first source metal pattern disposed on the fourth insulation layer and including a source electrode and a drain electrode, wherein the insulation layer may include: a fifth insulation layer covering the first source metal pattern; and a pixel-defining layer disposed on the fifth insulation layer.

The display device may further include: a dam structure disposed in the organic layer-removed area.

The display device may further include an encapsulation layer covering the light emitting element.

The display device may further include: a gate insulation pattern disposed between the second active pattern and the second gate electrode; and a dummy insulation pattern disposed between the bridge pattern and the third insulation layer.

The signal wiring may include a first fan-out line disposed in a same layer as the first gate electrode and a second fan-out line disposed in a same layer as the gate wiring pattern.

The power wiring is configured to transfer a power to the light-emitting element.

The power wiring may include: a first power wiring configured to transfer a first power voltage to the light-emitting element; and a second power wiring configured to transfer a second power voltage to the light-emitting element.

The signal wiring may be configured to transfer a data signal to at least one of the first transistor and the second transistor.

The first active pattern may include silicon, and the second active pattern may include oxide semiconductor.

A contact area of the bridge pattern and the first power wiring pattern extends along the first power wiring pattern.

According to one or more exemplary embodiments of the invention, a method for manufacturing a display device, the method includes: forming a first active pattern in a display area; forming a first insulation layer covering the first active pattern; forming a first gate metal pattern including a first gate electrode overlapping the first active pattern; forming a second insulation layer covering the first gate metal pattern; forming a second gate metal pattern overlapping the first gate metal pattern; forming a third insulation layer covering the second gate metal pattern; forming a second active pattern on the third insulation layer; forming a third gate metal pattern including: a second gate electrode overlapping the second active pattern; and a bridge pattern, the bridge pattern being disposed in a peripheral area surrounding the display area; forming a fourth insulation layer covering the third gate metal pattern; and forming a source metal pattern disposed on the fourth insulation layer, the source metal pattern including: a first power wiring pattern; and a second power wiring pattern spaced apart from the first power wiring pattern, wherein the first power wiring pattern and the second power wiring pattern are disposed in the peripheral area contacting the bridge pattern.

The method may further include: forming a fifth insulation layer covering the source metal pattern; forming a pixel-defining layer disposed on the fifth insulation layer; forming a light-emitting element on the fifth insulation layer and the pixel-defining layer; and removing at least a part of the fifth insulation layer and the pixel-defining layer in the peripheral area to form an organic layer-removed area.

Remaining portions of the fifth insulation layer and the pixel-defining layer after forming the organic layer-removed area may include a dam structure extending along the peripheral area.

The organic layer-removed area overlaps the bridge pattern.

The first gate metal pattern further may include a first fan-out line overlapping the bridge pattern.

The second gate metal pattern further may include a second fan-out line extending in parallel with the first fan-out line and overlapping the bridge pattern.

The first active pattern may include silicon, and the second active pattern may include oxide semiconductor.

A contact area of the bridge pattern and the first power wiring pattern may extend along the first power wiring pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
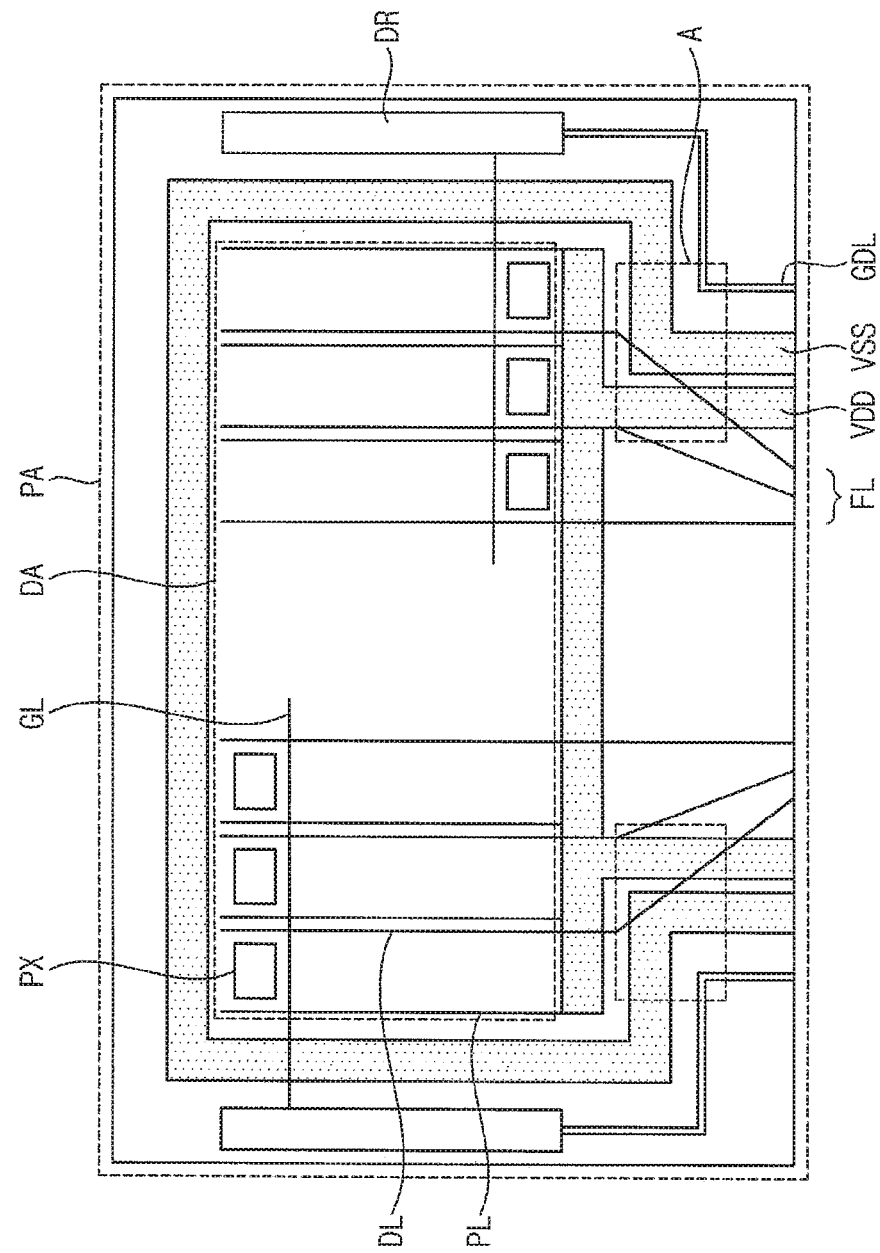
FIG. 1 is a plan view illustrating a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis and the D2-axis are not limited to three axes of a rectangular coordinate system, such as the x, y, and z—axes, and may be interpreted in a broader sense. For example, the D1-axis and the D2-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
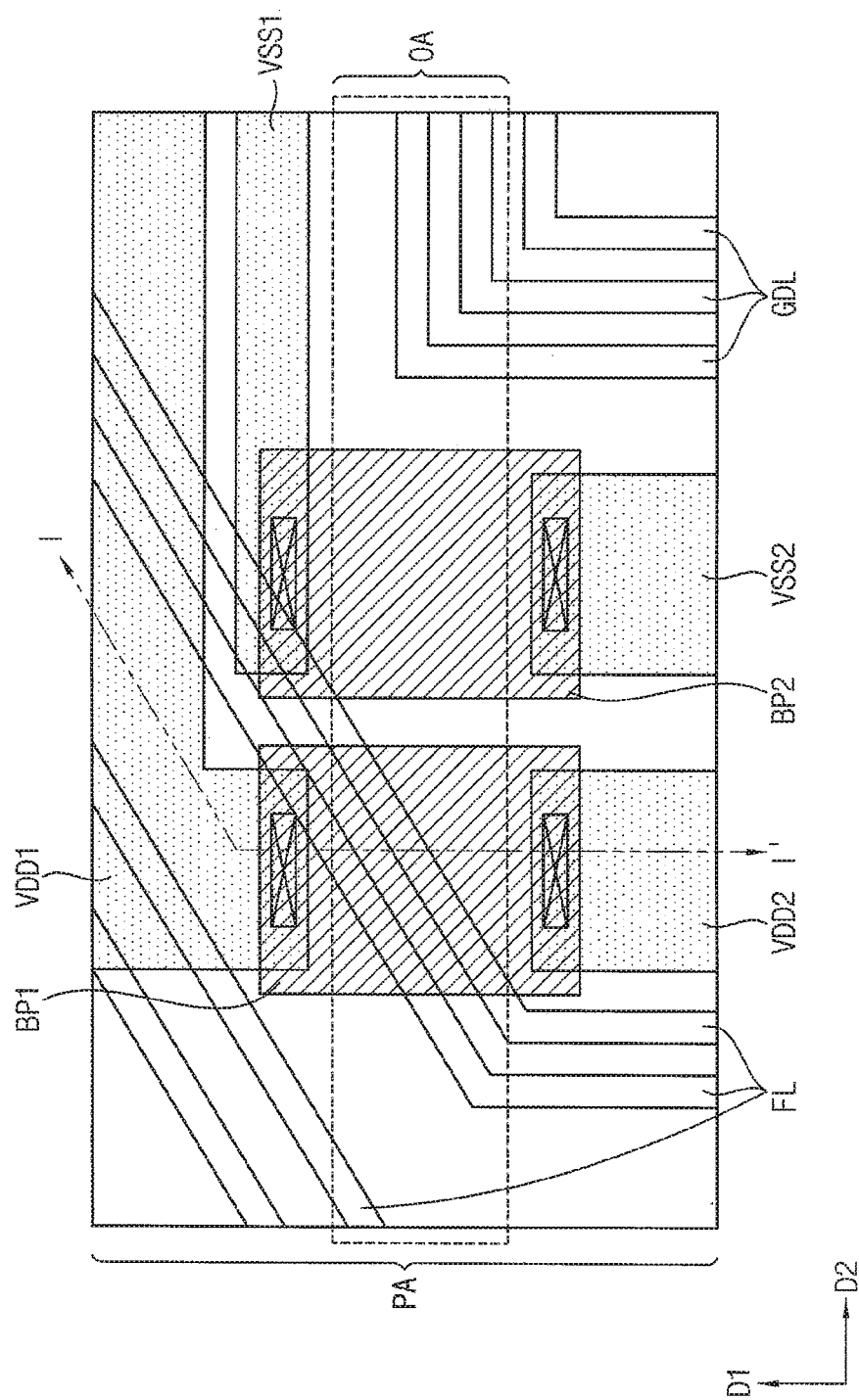
FIG. 2 is an enlarged plan view illustrating a region 'A' of FIG. 1.
Figure 3:
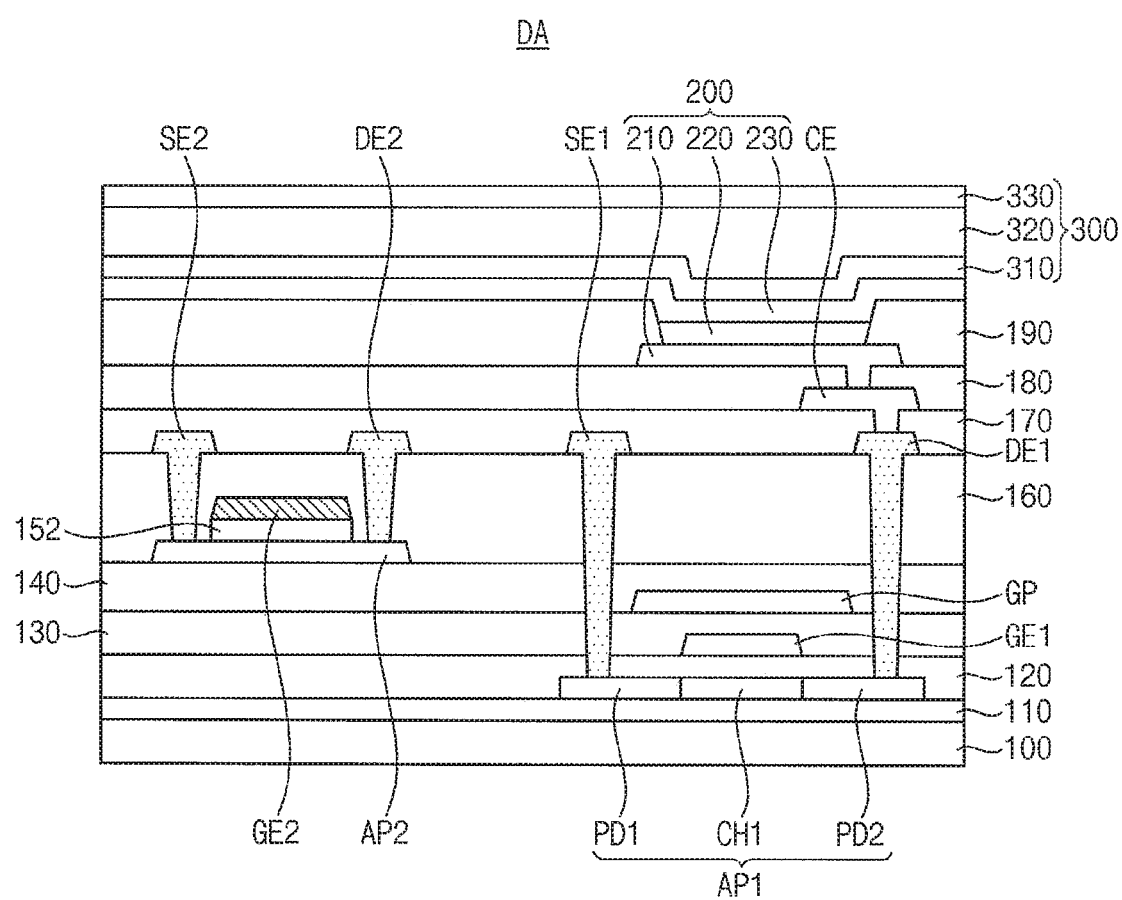
FIG. 3 is a cross-sectional view of a pixel unit of a display area.
Figure 4:
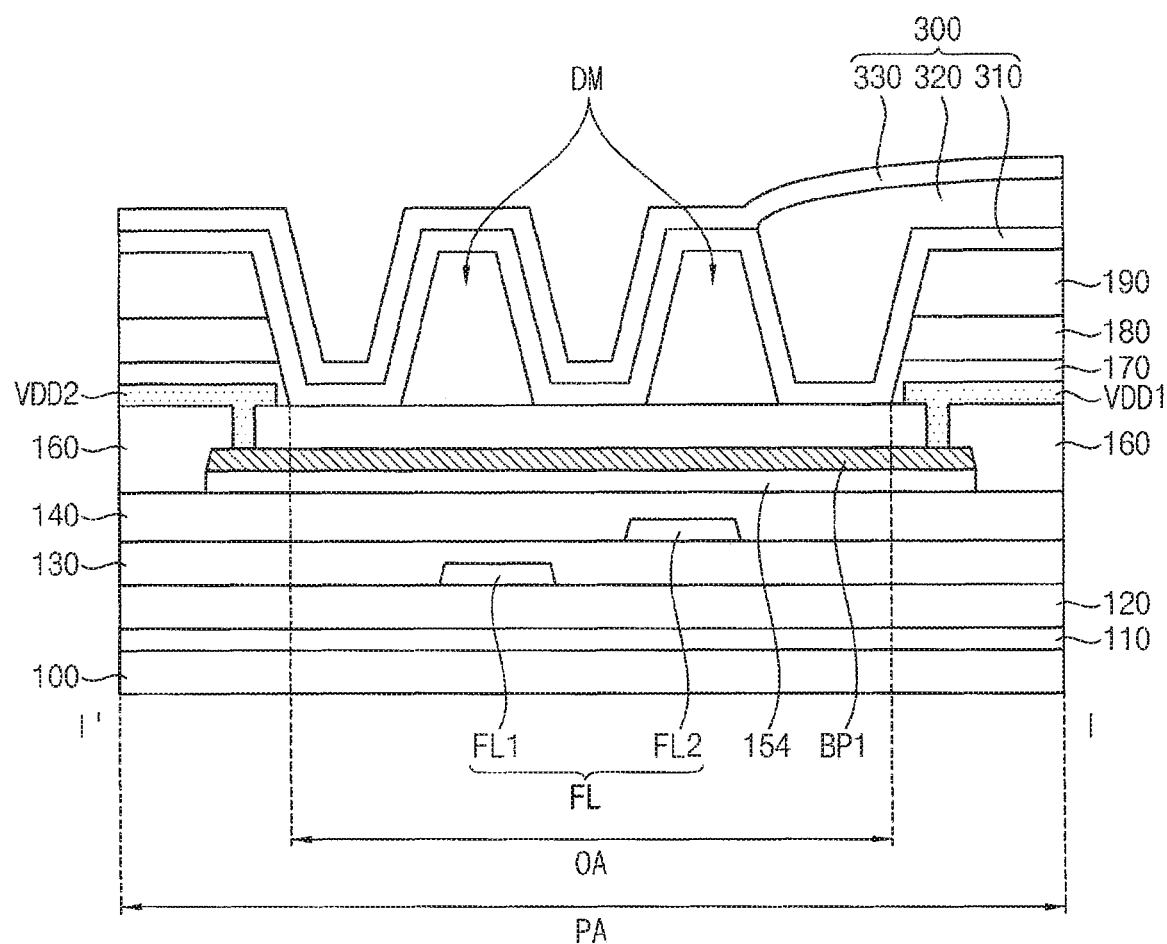
FIG. 4 is a cross-sectional view taken along a sectional line I-I' of FIG. 2.

FIG. 1 is a plan view illustrating a display device according to an exemplary embodiment. FIG. 2 is an enlarged plan view illustrating a region 'A' of FIG. 1. FIG. 3 is a cross-sectional view of a pixel unit of a display area. FIG. 4 is a cross-sectional view taken along a sectional line I-I' of FIG. 2.

Referring to FIG. 1, an organic light-emitting display device may include a display area DA and a peripheral area PA surrounding the display area DA. A pixel array including a plurality of pixels PX may be disposed in the display area DA.

Wirings may be disposed in the display area DA to provide a driving signal or a power to the pixels PX. For example, the wirings may include a data line DL transferring a data signal, a gate line GL transferring a gate signal (or a scan signal), a power line PL providing a power, or the like. For example, the data line DL and the power line PL may extend along a first direction D1, and the gate line GL may extend along a second direction D2 crossing the first direction D1. A pixel unit of the pixel array may include a light-emitting element for generating a light and a circuit part for driving the light-emitting element. In an exemplary embodiment, the light-emitting element may include an organic light-emitting diode, and the circuit part may include at least two transistors.

A signal wiring, a power wiring, a pad electrode or the like may be disposed in the peripheral area PA for driving the pixels PX. For example. The signal wiring may include a signal line transferring a driving signal to drive a switching element of the pixels PX. For example, the driving signal may include a data signal, a gate signal or the like. The power wiring may provide a power to the light-emitting element of the pixels PX through the power line PL or an electrode.

In an exemplary embodiment, a fan-out wiring FL, a first power wiring VDD, a second power wiring VSS, a driver DR, a driving signal wiring GDL may be disposed in the peripheral area PA. The fan-out wiring FL may transfer the data signal to the data line DL. The first power wiring VDD may provide a first power voltage to the pixels through the power line PL. The second power wiring VSS may provide a second power voltage to the pixels PX. The driver DR may provide the gate signal to the gate line GL. The driving signal wiring GDL may provide a driving signal to the driver DR. For example, the second power wiring VSS may be electrically connected to a second electrode of the light-emitting diode to provide the second power voltage to the light-emitting diode. Furthermore, additional wirings may be disposed in the peripheral area PA to transfer a light-emitting signal, a touch-sensing signal or the like.

For example, a portion of the peripheral area PA may bend to be disposed at a side surface or a rear surface of the organic light-emitting display device.

Referring to FIGS. 1 and 2, the fan-out wiring FL, the first power wiring VDD, the second power wiring VSS and the driving signal wiring VDL may extend toward a side of the organic light-emitting display device, and may be electrically connected to a driving chip, a printed circuit board or the like to receive signals and power therefrom.

In an exemplary embodiment, the organic light-emitting display device may include an organic layer-removed area OA disposed in the peripheral area PA. An organic layer is removed in at least a portion of the organic layer-removed area OA. Thus, humidity may be prevented or suppressed from penetrating into the display area DA through the organic layer from an edge of the organic light-emitting display device. The removed organic layer in exemplary embodiments may include a via insulation layer, a pixel-defining layer or combination thereof, which are disposed under the organic light-emitting diode in the organic light-emitting display device.

In an exemplary embodiment, the organic layer-removed area OA may extend along the peripheral area PA to have a shape surrounding the display area DA In the peripheral area PA, the power wiring and the signal wiring may partially overlap each other. In an exemplary embodiment, in the organic layer-removed area OA, at least one of the first power wiring VDD and the second power wiring VSS may overlap the fan-out wiring FL.

In an exemplary embodiment, at least one of the first power wiring VDD and the second power wiring VSS may be extended through a bridge in the peripheral area PA.

For example, the first power wiring VDD may include a first power wiring pattern VDD1 and a second power wiring pattern VDD2 spaced apart from each other along the first direction D1. The first power wiring pattern VDD1 and the second power wiring pattern VDD2 may be electrically connected to each other through a first bridge pattern BP1. The second power wiring VSS may include a third power wiring pattern VSS1 and a fourth power wiring pattern VSS2 spaced apart from each other along the first direction D1. The third power wiring pattern VSS1 and the fourth power wiring pattern VSS2 may be electrically connected to each other through a second bridge pattern BP2.

In an exemplary embodiment, the first power wiring pattern VDD1 and the second power wiring pattern VDD2 may be disposed in a same layer. The first bridge pattern BP1 may be disposed in a different layer from the first power wiring pattern VDD1 and the second power wiring pattern VDD2. The third power wiring pattern VSS1 and the fourth power wiring pattern VSS2 may be disposed in a same layer. The second bridge pattern BP2 may be disposed in a different layer from the third power wiring pattern VSS1 and the fourth power wiring pattern VSS2.

The fan-out wiring FL may include a plurality of fan-out lines extending along the first direction D1 or along a perspective direction crossing the first direction D1 in the peripheral area PA.

The organic layer-removed area OA may extend along the second direction D2 in an area overlapping the power wiring and the signal wiring.

In an exemplary embodiment, at least a portion of the first bridge pattern BP1 and the second bridge pattern BP2 overlaps the organic layer-removed area OA. Furthermore, at least a portion of the first bridge pattern BP1 and the second bridge pattern BP2 may overlap the fan-out wiring FL. Thus, the fan-out wiring FL, the bridge pattern and the power wiring may be disposed in different layers and may overlap the organic layer-removed area OA.

FIGS. 3 and 4 illustrate cross-sections of the organic layer-removed area, where the bridge pattern is disposed, and the pixel unit, respectively.

Referring to FIG. 3, the pixel unit disposed in the display area DA includes a driving transistor based on a base substrate 100, a switching transistor for controlling the driving transistor, an organic light-emitting diode 200 electrically connected to the driving transistor and an encapsulation layer 300 covering the organic light-emitting diode 200.

A buffer layer 110 may be disposed on the base substrate 100. A first active pattern AP1 may be disposed on the buffer layer 110. A first gate electrode GE1 may be disposed on the first active pattern AP1. A first insulation layer 120 may be disposed between the first active pattern AP1 and the first gate electrode GE1.

A gate wiring pattern GP may be disposed on the first gate electrode GE1. The gate wiring pattern GP may include a capacitor electrode for forming a capacitor, a wiring for transferring signals, or the like. A second insulation layer 130 may be disposed between the first gate electrode GE1 and the gate wiring pattern GP.

A third insulation layer 140 may be disposed on the gate wiring pattern GP. A second active pattern AP2 may be disposed on the third insulation layer 140. A second gate electrode GE2 may be disposed on the second active pattern AP2. A gate insulation pattern 152 may be disposed between the second active pattern AP2 and the second gate electrode GE2.

A fourth insulation layer 160 may be disposed on the second gate electrode GE2. A first source metal pattern may be disposed on the fourth insulation layer 160. The first source metal pattern may include a first source electrode SE1 electrically contacting the first active pattern AP1, a first drain electrode DE1 electrically contacting the first active pattern AP1, a second source electrode SE2 electrically contacting the second active pattern AP2 and a second drain electrode DE2 electrically contacting the second active pattern AP2. The first source electrode SE1, the first drain electrode DE1, the second source electrode SE2 and the second drain electrode DE2 may pass through insulation layers disposed thereunder to contact the active patterns, respectively.

A fifth insulation layer 170 may be disposed on the first source metal pattern. A second source metal pattern may be disposed on the fifth insulation layer 170. The second source electrode pattern may include a connection electrode CE electrically connecting the first drain electrode DE1 to the organic light-emitting diode 200. In an exemplary embodiment, the second source electrode pattern may further include a mesh wiring to prevent or suppress voltage reduction of a power provided to the organic light-emitting diode 200.

A sixth insulation layer 180 may be disposed on the second source metal pattern. The organic light-emitting diode 200 may be disposed on the sixth insulation layer 180. The organic light-emitting diode 200 may include a first electrode 210, a light-emitting layer 220 and a second electrode 230. The first electrode 210 electrically contacts the connection electrode CE. The light-emitting layer 220 is disposed on the first electrode 210. The second electrode 230 is disposed on the light-emitting layer 220. At least a portion of the light-emitting layer 220 may be disposed in an opening of a pixel-defining layer 190 disposed on the sixth insulation layer 180.

The encapsulation layer 300 may be disposed entirely in the display area DA to cover the organic light-emitting diode 200.

For example, the encapsulation layer 300 may have a stacked structure of an organic thin film and an inorganic thin film. For example, as illustrated in FIG. 3, the encapsulation layer 300 may include a first inorganic thin film 310, an organic thin film 320 disposed on the first inorganic thin film 310 and a second inorganic thin film 330 disposed on the organic thin film 320. However, exemplary embodiments are not limited thereto. For example, the encapsulation layer 300 may have a structure including at least two organic thin films and at least three inorganic thin films.

Referring to FIG. 4, a fan-out wiring FL, a first bridge pattern BP1 and a dam structure DM may be disposed in an organic layer-removed area OA.

The fan-out wiring FL may include a first fan-out line FL1 and a second fan-out line FL2, which are disposed in different layers.

For example, the first fan-out line FL1 may be formed from a same layer as the first gate electrode GE1 to be disposed on the first insulation layer 120. The second first fan-out line FL2 may be formed from a same layer as the gate wiring pattern GP to be disposed on the second insulation layer 130.

In an exemplary embodiment, the first bridge pattern BP1 may be formed from the second gate electrode GE2 disposed in the display area DA. Thus, the first bridge pattern BP1 may be disposed between the third insulation layer 140 and the fourth insulation layer 160. In an exemplary embodiment, a dummy insulation pattern 154 may be disposed between the first bridge pattern BP1 and the third insulation layer 140. In an exemplary embodiment, the second bridge pattern BP2 may be formed from a same layer as the first bridge pattern BP2.

A dam structure DM may be disposed on the fourth insulation layer 160. The dam structure DM may prevent or suppress monomers from over-flowing into the peripheral area in the process of forming the organic thin film 320 of the encapsulation layer 300. The dam structure DM may be formed from a same layer as the fifth insulation layer 170, the sixth insulation layer 180, the pixel-defining layer 190 or a combination thereof.

The dam structure DM may be disposed in the organic layer-removed area OA. The dam structure DM may extend along the organic layer-removed area OA to have a shape surrounding the display area DA. The dam structure DM is separated from the fifth insulation layer 170, the sixth insulation layer 180 and the pixel-defining layer 190, which extend from the display area DA or other portion of the peripheral area PA. Thus, disconnection of organic layers may be maintained.

In an exemplary embodiment, a portion of the organic thin film 320 may be disposed in the organic layer-removed area OA. However, the organic thin film 320 may be excluded from the "organic layer" of the organic layer-removed area OA intended by exemplary embodiments. Furthermore, the organic thin film 320 may not extend to a distal end of the display device, and may be separated from the organic light-emitting diode by the first inorganic thin film 310. Thus, humidity penetration through the organic thin film 320 may be prevented or suppressed.

In an exemplary embodiments, the dam structure DM may include a plurality of structures. For example, a first dam structure and a second dam structure spaced apart from the first dam structure may be disposed in the organic layer-removed area OA. However, exemplary embodiments are not limited thereto. For example, a single dam structure or at least three dam structures may be disposed in the organic layer-removed area OA, as desired.

A first power wiring pattern VDD1 and a second power wiring pattern VDD2 may be disposed on the fourth insulation layer 160. The first power wiring pattern VDD1 may be spaced apart from the second power wiring pattern VDD2 along the first direction D1.

For example, each of the first power wiring pattern VDD1 and the second power wiring pattern VDD2 may pass through the fourth insulation layer 160 to contact the first bridge pattern BP1. Thus, a driving signal applied to the second power wiring pattern VDD2 by a printed circuit board or a driving chip may be transferred to the first power wiring pattern VDD1 through the first bridge pattern BP1.

In an exemplary embodiment, the first power wiring pattern VDD1 and the second power wiring pattern VDD2 may be formed from a same layer as the source electrodes and the drain electrodes disposed in the display area DA. Thus, the first power wiring pattern VDD1 and the second power wiring pattern VDD2 may be disposed in a same layer as the source electrodes and the drain electrodes disposed in the display area DA and may be included in the first source metal pattern.

When the power wiring is continuously formed from the first source metal pattern in the peripheral area PA without the first bridge pattern BP1, the power wiring may be exposed in the organic layer-removed area OA in the process of forming the first electrode 210 of the organic light-emitting diode. Thus, the power line may be damaged or may have an undercut. Thus, a crack of the inorganic layer of the encapsulation layer 300 formed on the power wiring may be generated in the organic layer-removed area OA.

According to an exemplary embodiment, the power line of the organic light-emitting display device is continued by the bridge pattern in the organic layer-removed area OA. The bridge pattern may be formed from the second gate electrode GE2 disposed in the display area DA. Thus, the bridge pattern may be protected by the fourth insulation layer 160 even if the fifth insulation layer 170, the sixth insulation layer 180 and the pixel-defining layer 190 are removed in the organic layer-removed area OA. Thus, generation of a crack of the inorganic layer in the organic layer-removed area OA may be prevented or suppressed.

FIGS. 5A, 5B, 6A, 6B, 7A, 7B, 8A, 8B, 9A, 9B, 10A, and 10B are cross-sectional views illustrating a method for manufacturing a display device according to an exemplary embodiment. FIGS. 5A, 6A, 7A, 8A, 9A, and 10A illustrate a pixel unit in a display area, and FIGS. 5B, 6B, 7B, 8B, 9B, and 10B illustrate an organic layer-removed area.

Figure 5A:
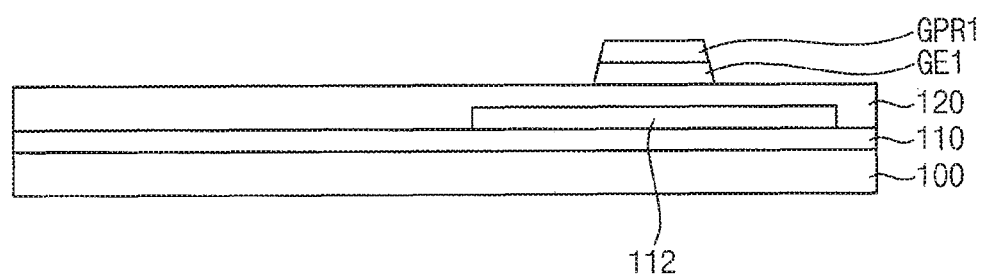
FIGS. 5A, 5B, 6A, 6B, 7A, 7B, 8A, 8B, 9A, 9B, 10A, and 10B are cross-sectional views illustrating a method for manufacturing a display device according to an exemplary embodiment.

Referring to FIG. 5A, a semiconductor pattern 112 is formed on a base substrate 100.

The base substrate 100 may include glass, quartz, silicon, a polymer or the like. For example, the polymer may include polyethylene terephthalate, polyethylene naphthalate, polyether ketone, polycarbonate, polyarylate, polyether sulfone, polyimide or a combination thereof.

A buffer layer 110 may be disposed between the semiconductor pattern 112 and the base substrate 100. Thus, the semiconductor pattern 112 may be formed on the buffer layer 110. The buffer layer 110 may prevent or reduce penetration of impurities, humidity or external gas from underneath of the base substrate 100, and may planarize an upper surface of the base substrate 100. For example, the buffer layer 110 may include an inorganic material such as oxide, nitride or the like. In an exemplary embodiment, the buffer layer 110 may have a multiple-layered structure including a lower layer including silicon nitride and an upper layer including silicon oxide.

For example, the semiconductor pattern 112 may include polycrystalline silicon (polysilicon). In order to form the semiconductor pattern 112, an amorphous silicon layer may be formed on the base substrate 100 and then crystallized to form a polysilicon layer.

For example, the amorphous silicon layer may be formed through sputtering, low-pressure chemical vapor deposition (LPCVD), plasma-enhanced chemical vapor deposition (PECVD) or the like. The amorphous silicon layer may be crystallized through excimer laser annealing (ELA), sequential lateral solidification (SLS) or the like.

For example, the polysilicon layer may be polished by chemical mechanical polishing (CMP) or the like to planarize a surface thereof. Thereafter, the polysilicon layer may be patterned by a photolithography or the like to form the semiconductor pattern. The semiconductor pattern may be doped with n-type impurities or p-type impurities as desired.

Thereafter, a first insulation layer 120 is formed to cover the semiconductor pattern 112. The first insulation layer 120 may insulate a channel, which is formed from the semiconductor pattern 112, from a gate electrode formed on the first insulation layer 120.

For example, the first insulation layer 120 may include silicon oxide, silicon nitride, silicon carbide or a combination thereof. Furthermore, the first insulation layer 120 may include an insulating metal oxide such as aluminum oxide, tantalum oxide, hafnium oxide, zirconium oxide, titanium oxide or the like. For example, the first insulation layer 120 may have a single-layered structure or a multiple-layered structure including silicon nitride and/or silicon oxide.

Thereafter, a first gate metal layer is formed on the first insulation layer 120, and a first photoresist pattern is formed on the first gate metal layer.

For example, the first gate metal layer may include a metal, a metal alloy, a metal nitride, a conductive metal oxide or the like. For example, the first gate metal layer may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multiple-layered structure including different metal layers.

Figure 5B:
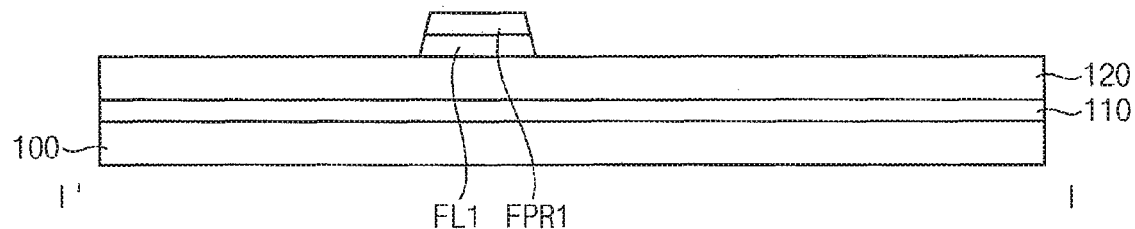

Referring to FIGS. 5A and 5B, the first photoresist pattern may include a first gate photoresist pattern GPR1 partially overlapping the semiconductor pattern 112 and a first fan-out photoresist pattern FPR1 disposed in the peripheral area PA.

For example, a photoresist composition including a binder resin such as a phenol resin, an acryl resin or the like may be coated, exposed to a light and developed to form the first photoresist pattern.

Thereafter, the first gate metal layer is etched by using the first photoresist pattern as a mask to form a first gate metal pattern including a first gate electrode GE1 and a first fan-out line FL1. For example, the first gate metal layer may be etched by a dry etching method using plasma or the like.

Figure 6A:
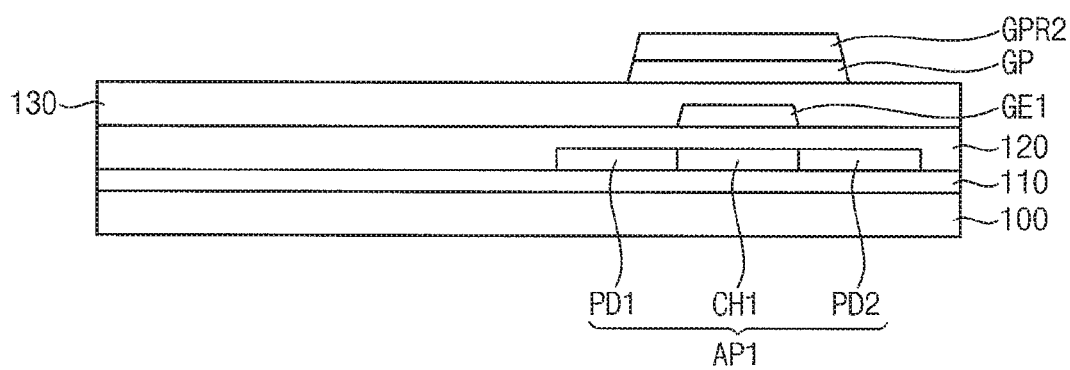

Referring to FIG. 6A, impurities are provided to the semiconductor pattern 112 to form a first active pattern AP1.

In an exemplary embodiment, the impurities may include p-type impurities such as boron or the like. However, exemplary embodiments are not limited thereto. For example, the impurities may include n-type impurities such as phosphor, arsenic or the like. For example, the n-type impurities may be doped with different areas with a high concentration and a low concentration.

As a result, a peripheral portion of the semiconductor pattern 112, which does not overlap the first gate electrode GE1, is doped with the impurities to form a first doped area PD1 and a second doped area PD2. In the semiconductor pattern 112, a portion overlapping the first gate electrode GE1 remains without being doped to define a channel area CH1.

Thus, the first doped area PD1, the second doped area PD2 and the channel area CH1 may be disposed continuously in a same layer. The pattern including the first doped area PD1, the second doped area PD2 and the channel area CH1 may be define a first active pattern AP1.

The first photoresist pattern including the first gate photoresist pattern GPR1 may be removed before or after the doping process.

Thereafter, a second insulation layer 130 is formed to cover the first gate metal pattern including the first gate electrode GE1. A second gate metal layer is formed on the second insulation layer 130. A second photoresist pattern is formed on the second gate metal layer.

For example, the second insulation layer 130 may include silicon oxide, silicon nitride, silicon carbide or a combination thereof. Furthermore, the second insulation layer 130 may include an insulating metal oxide such as aluminum oxide, tantalum oxide, hafnium oxide, zirconium oxide, titanium oxide or the like. For example, the second insulation layer 130 may include silicon nitride.

In an exemplary embodiment, the second gate metal layer may include a metal, a metal alloy, a metal nitride, a conductive metal oxide or the like. For example, the first gate metal layer may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multiple-layered structure including different metal layers.

Figure 6B:
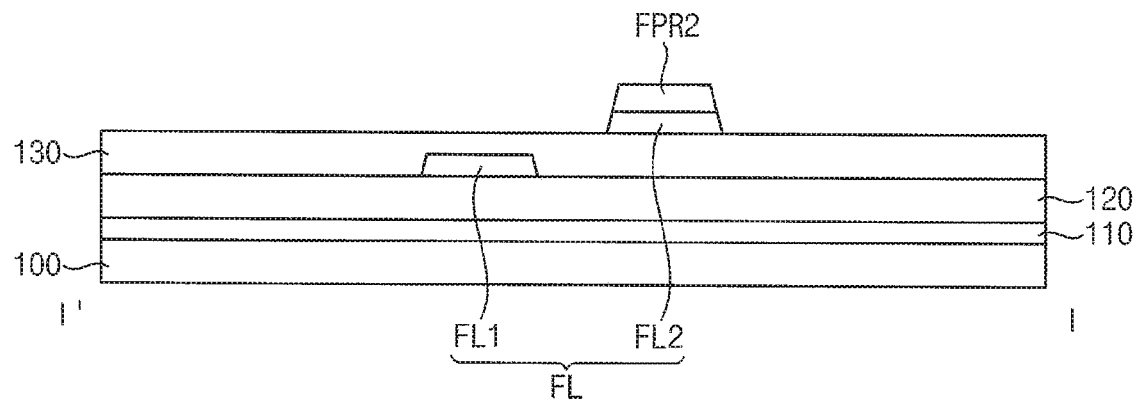

Referring to FIGS. 6A and 6B, the second photoresist pattern may include a second gate photoresist pattern GPR2 disposed in the display area DA and a second fan-out photoresist pattern FPR2 disposed in the peripheral area PA.

Thereafter, the second gate metal layer is etched by using the second photoresist pattern as a mask to form a second gate metal pattern including a gate wiring pattern GP and a second fan-out line FL2. For example, the second gate metal layer may be etched by a dry etching method using plasma or the like.

For example, the gate wiring pattern GP may include a capacitor electrode, an initializing signal wiring providing an initializing signal, a light-emitting signal wiring providing a light-emitting signal or the like. In an exemplary embodiment, at least a portion of the gate wiring pattern GP may overlap the first gate metal pattern.

In an exemplary embodiment, the second fan-out line FL2 may be spaced apart from the first fan-out line FL1 along a horizontal direction not to overlap the first fan-out line FL1.

In an exemplary embodiment, the driving signal wiring GDL illustrated in FIG. 2 may be formed from the first gate metal layer, the second gate metal layer or a combination thereof.

Figure 7A:
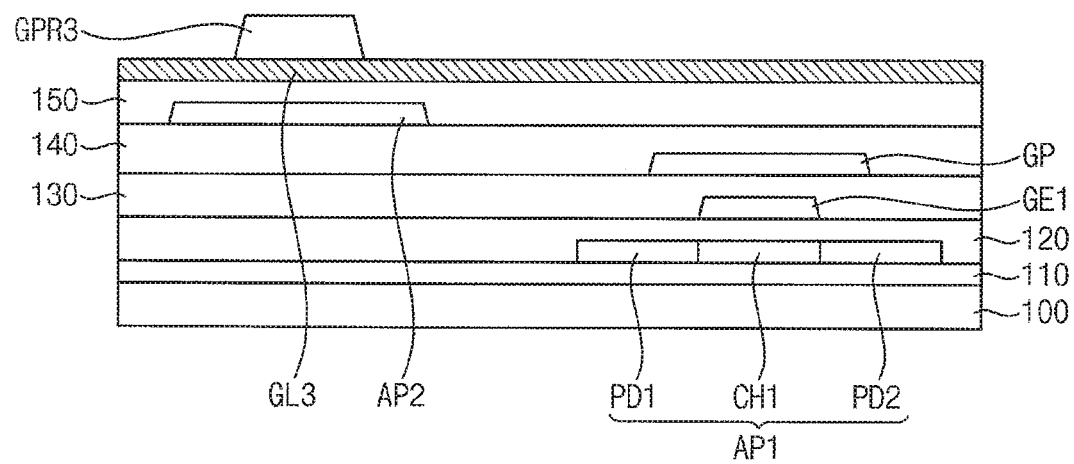
Figure 7B:
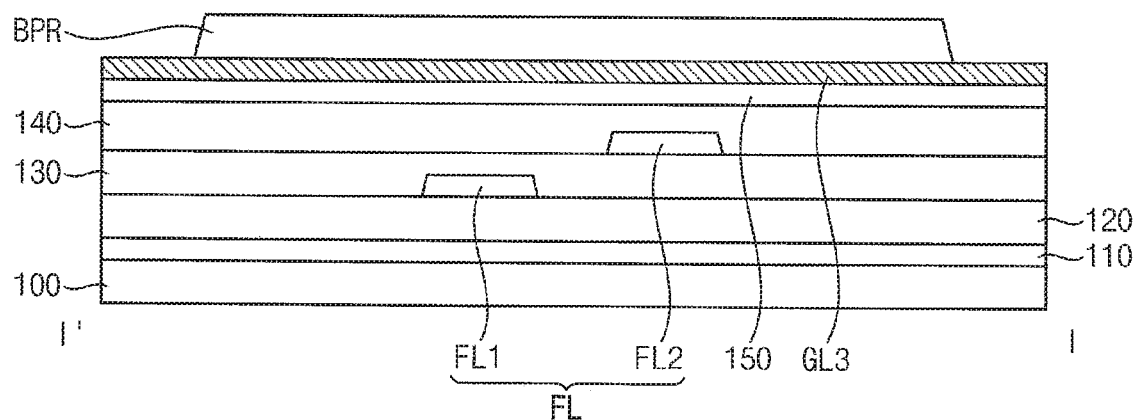

Referring to FIGS. 7A and 7B, a third insulation layer 140 is formed to cover the second gate metal pattern including the gate wiring pattern GP. A second active pattern AP2 is formed on the third insulation layer 140.

For example, the third insulation layer 140 may include silicon oxide, silicon nitride, silicon carbide or a combination thereof. Furthermore, the third insulation layer 140 may include an insulating metal oxide such as aluminum oxide, tantalum oxide, hafnium oxide, zirconium oxide, titanium oxide or the like. For example, the third insulation layer 140 may include silicon oxide.

The second active pattern AP2 includes an oxide semiconductor. For example, the second active pattern AP2 may include two-component compound (ABx), ternary compound (ABxCy) or four-component compound (ABxCyDz), which contains indium (In), zinc (Zn), gallium (Ga), tin (Sn), titanium (Ti), aluminum (Al), hafnium (Hf), zirconium (Zr), magnesium (Mg). For example, the second active pattern AP2 may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), or the like.

Thereafter, a preliminary insulation layer 150 is formed to cover the second active pattern AP2. A third gate metal layer GL3 is formed on the preliminary insulation layer 150. A third photoresist pattern is formed on the third gate metal layer GL3.

For example, the preliminary insulation layer 150 may include silicon oxide, silicon nitride, silicon carbide or a combination thereof. Furthermore, the preliminary insulation layer 150 may include an insulating metal oxide such as aluminum oxide, tantalum oxide, hafnium oxide, zirconium oxide, titanium oxide or the like. For example, the preliminary insulation layer 150 may include silicon oxide.

For example, the third gate metal layer GL3 may include a metal, a metal alloy, a metal nitride, a conductive metal oxide or the like. For example, the third gate metal layer GL3 may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multiple-layered structure including different metal layers.

The third photoresist pattern may include a third gate photoresist pattern GPR3 disposed in the display area DA and a bridge photoresist pattern BPR disposed in the peripheral area PA.

Figure 8A:
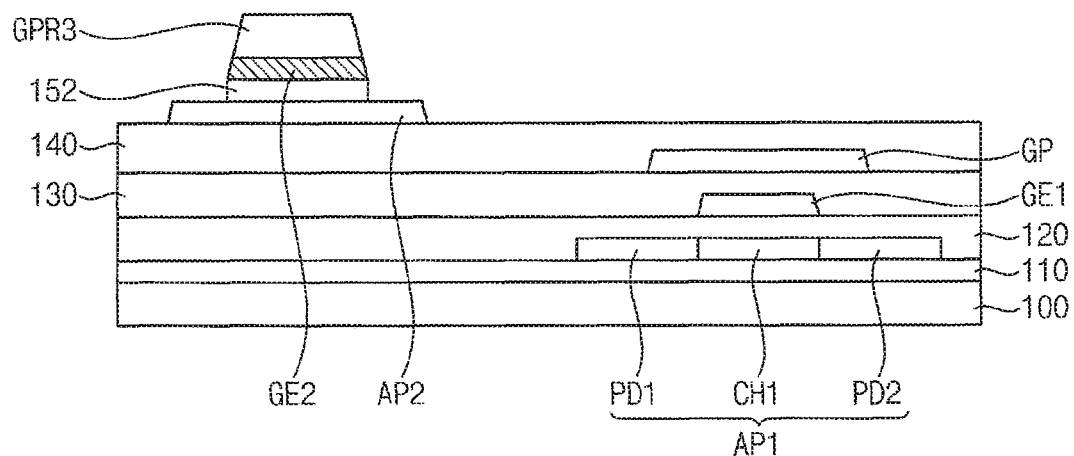
Figure 8B:
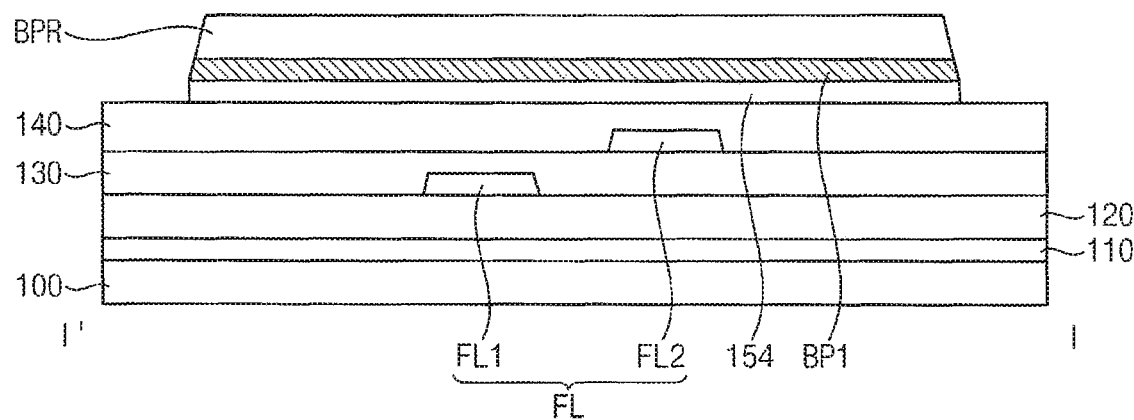

Referring to FIGS. 8A and 8B, the third gate metal layer GL3 is etched by using the third photoresist pattern as a mask to form a third gate metal pattern including a second gate electrode GE2 and a first bridge pattern BP1. For example, the third gate metal layer may be etched by a dry etching method using plasma or the like. The third gate metal pattern may further include the second bridge pattern BP2 illustrated in FIG. 2.

The preliminary insulation layer 150 is etched by using the third gate metal pattern as a mask to form a gate insulation pattern 152 disposed between the second gate electrode GE2 and the second active pattern AP2. Thus, the gate insulation pattern 152 may have a substantially same shape as the second gate electrode GE2 in a plan view.

In the process of forming the gate insulation pattern 152, a portion of the preliminary insulation layer 150, which is adjacent to the first bridge pattern BP1, may be etched, and a portion of the preliminary insulation layer 150, which is disposed under the first bridge pattern BP1, may remain thereby forming a dummy insulation pattern 154 disposed between the first bridge pattern BP1 and the third insulation layer 140.

In the process of forming the gate insulation pattern 152 or by an additional process, a metallic element may be reduced to a metal in an exposed portion of the second active pattern AP2 thereby increasing a conductivity of the second active pattern AP2. Thus, the exposed portion of the second active pattern AP2 may function as an ohmic contact or as a conductor.

Figure 9A:
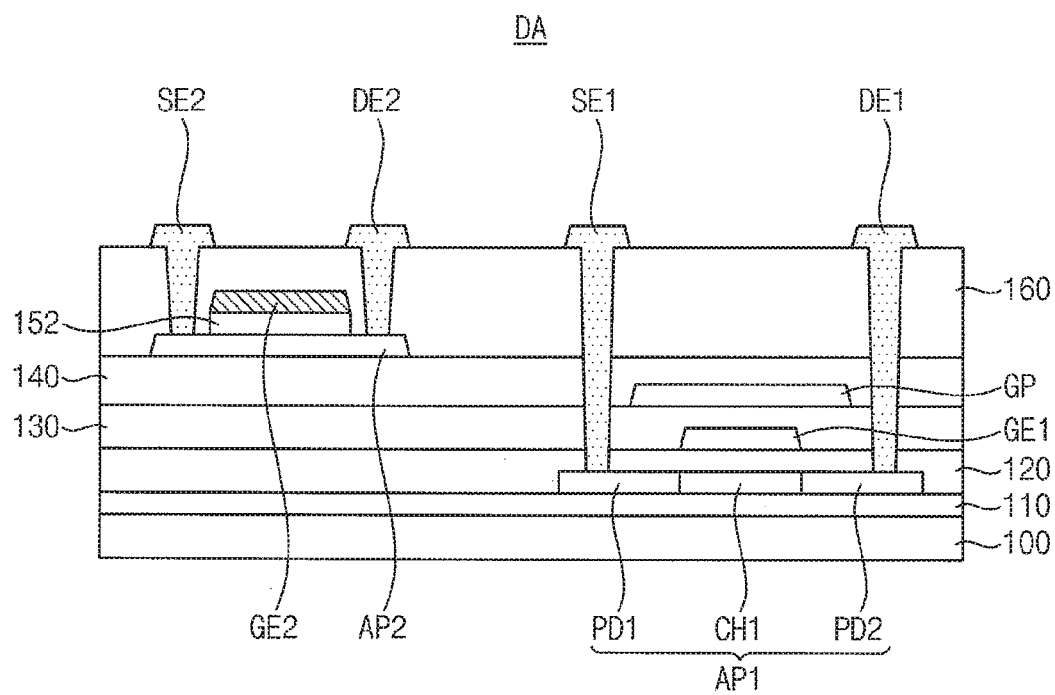
Figure 9B:
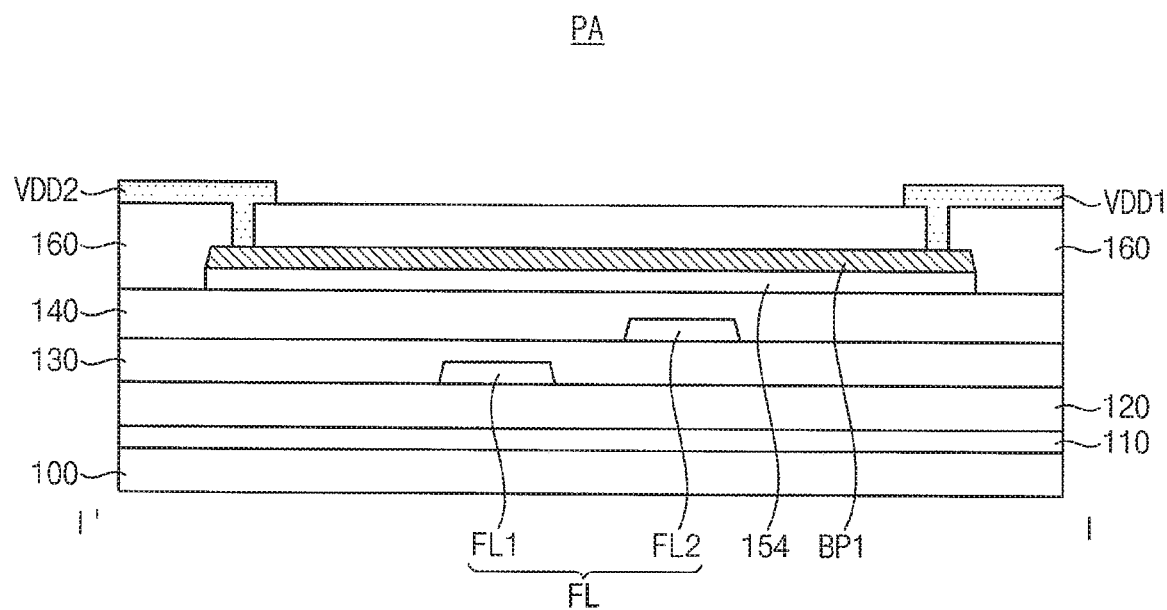

Referring to FIGS. 9A and 9B, a fourth insulation layer 160 is formed to cover the third gate metal pattern. The fourth insulation layer 160 is patterned to form contact holes exposing the first bridge pattern BP1, the second active pattern AP2 and the doped areas PD1 and PD2 of the first active pattern AP1. In an exemplary embodiment, the contact holes exposing the first active pattern AP1 may be formed in a different process from the contact holes exposing the second active pattern AP2. The contact hole exposing the first bridge pattern BP1 may be formed in a same process as the contact holes exposing the second active pattern AP2.

Thereafter, a first source metal layer is formed to fill the contact holes. The first source metal layer is patterned to form a first source metal pattern including a first source electrode SE1 contacting the first doped area PD1 of the first active pattern AP1, a first drain electrode DE1 contacting the second doped area PD2 and spaced apart from the first source electrode SE1, a second source electrode SE2 contacting the second active pattern AP2, a second drain electrode DE2 contacting the second active pattern AP2 and spaced apart from the second source electrode SE2, a first power wiring pattern VDD1 contacting the first bridge pattern BP1 and a second power wiring pattern VDD2 contacting the first bridge pattern BP1 and spaced apart from the first power wiring pattern VDD1. The first source metal pattern may further include the third power wiring pattern VSS1 and the fourth power wiring pattern VSS2, which are illustrated in FIG. 2.

For example, the fourth insulation layer 160 may include silicon oxide, silicon nitride, silicon carbide or a combination thereof. Furthermore, the fourth insulation layer 160 may include an insulating metal oxide such as aluminum oxide, tantalum oxide, hafnium oxide, zirconium oxide, titanium oxide or the like. For example, the fourth insulation layer 160 may have a multiple-layered structure including a lower layer including silicon oxide and an upper layer including silicon nitride.

For example, the first source metal layer may include a metal, a metal alloy, a metal nitride, a conductive metal oxide or the like. For example, the first source metal layer may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multiple-layered structure including different metal layers.

Figure 10A:
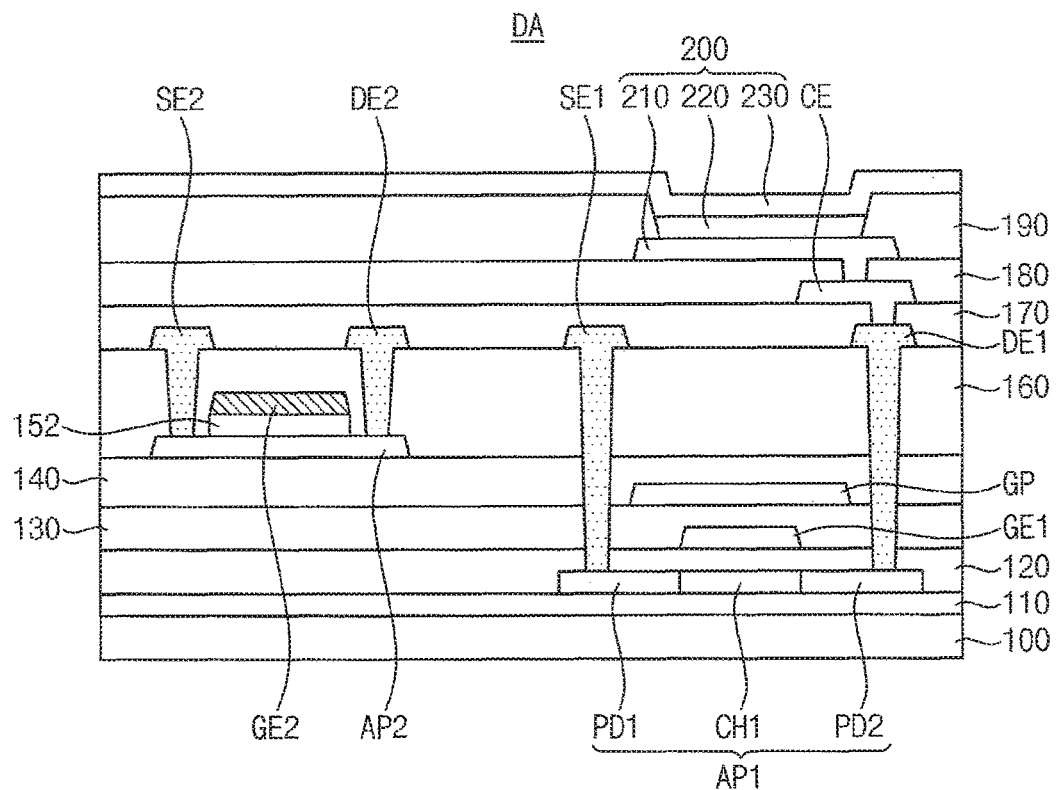
Figure 10B:
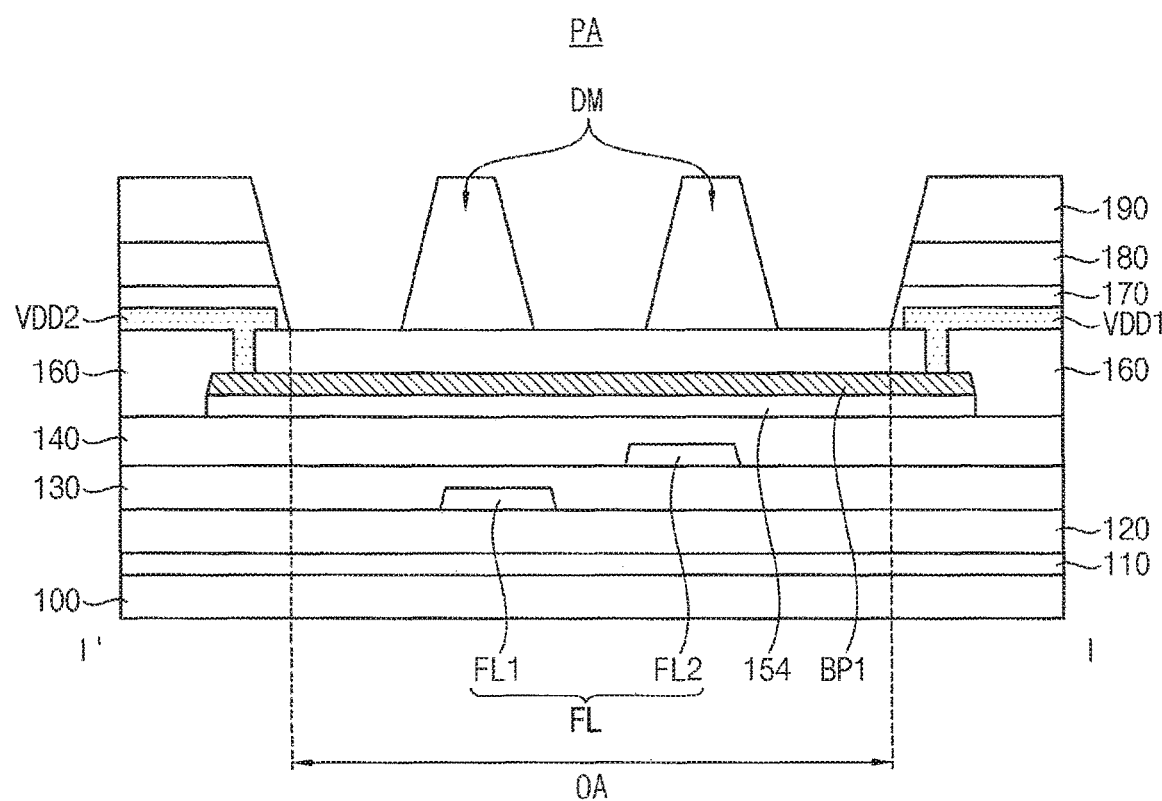

Referring to FIGS. 10A and 10B, a fifth insulation layer 170 is formed to cover the first source metal pattern. The fifth insulation layer 170 is patterned to form a contact hole exposing the first drain electrode DE1. In an exemplary embodiment, the fifth insulation layer 170 may cover the first power wiring pattern VDD1 and the second power wiring pattern VDD2.

Thereafter, a second source metal layer is formed to fill the contact hole, and then patterned to form a second source metal pattern including a connection electrode CE contacting the first drain electrode DE1.

Thereafter, a sixth insulation layer 180 is formed to cover the connection electrode CE. The sixth insulation layer 180 is patterned to form a contact hole exposing the connection electrode CE.

Thereafter, a first electrode layer is formed to fill the contact hole, and then patterned to form a first electrode 210 of an organic light-emitting diode 200.

For example, the fifth insulation layer 170 and the sixth insulation layer 180 may include an organic insulation material such as a phenol resin, an acryl resin, a polyimide resin, a polyamide resin, a siloxane resin, an epoxy resin or the like. The fifth insulation layer 170 and the sixth insulation layer 180 may have a flat upper surface to planarize an upper surface of the substrate.

In an exemplary embodiment, the first electrode 210 may function as an anode. For example, the first electrode 210 may be formed as a transmitting electrode or a reflecting electrode according to an emission type of the display device. When the first electrode 210 is a transmitting electrode, the first electrode 210 may include indium tin oxide, indium zinc oxide, zinc tin oxide, indium oxide, zinc oxide, tin oxide or the like. When the first electrode 210 is a reflecting electrode, the first electrode 210 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including the material that may be used for the transmitting electrode.

A pixel-defining layer 190 may be formed on the sixth insulation layer 180. The pixel-defining layer 190 may include an opening that exposes at least a portion of the first electrode 210. For example, the pixel-defining layer 190 may include an organic insulation material.

In another exemplary embodiment, the second source metal pattern including the connection electrode CE and the sixth insulation layer 180 may be omitted. Thus, the first electrode 210 may contact the first drain electrode DE1, and the pixel-defining layer 190 may be disposed on the fifth insulation layer 170.

In an exemplary embodiment, the fifth insulation layer 170, the sixth insulation layer 180 and the pixel-defining layer 190, which include an organic material, are removed in a portion of the peripheral area PA to form an organic layer-removed area OA. Thus, the fifth insulation layer 170, the sixth insulation layer 180 and the pixel-defining layer 190 may include an opening corresponding to the organic layer-removed area OA.

The organic layer-removed area OA may overlap at least a portion of each of the first bridge pattern BP1, the second bridge pattern BP2 and the fan-out wiring FL.

In an exemplary embodiment, a portion of at least one of the fifth insulation layer 170, the sixth insulation layer 180 and the pixel-defining layer 190 may remain to form a dam structure DM. The dam structure DM is spaced apart from the fifth insulation layer 170, the sixth insulation layer 180 and the pixel-defining layer 190 for disconnection of an organic layer.

A light-emitting layer 220 is formed on the first electrode 210. The light-emitting layer 220 may include at least one of a hole injection layer (HIL), a hole transporting layer (HTL), an organic light-emitting layer, an electron transporting layer (ETL) and an electron injection layer (EIL). For example, the light-emitting layer 220 may include a low molecular weight organic compound or a high molecular weight organic compound.

In an exemplary embodiment, the light-emitting layer 220 may emit a red light, a green light or a blue light. In another exemplary embodiment, the light-emitting layer 220 may emit a white light. The light-emitting layer 220 emitting a white light may have a multiple-layer structure including a red-emitting layer, a green-emitting layer and a blue-emitting layer, or a single-layer structure including a mixture of a red-emitting material, a green-emitting material and a blue-emitting material.

For example, the light-emitting layer 220 may be formed by a screen printing method, an inkjet printing method, a deposition method or the like.

A second electrode 230 is formed on the light-emitting layer 220. In an exemplary embodiment, the second electrode 230 may function as a cathode. For example, the second electrode 230 may be formed as a transmitting electrode or a reflecting electrode according to an emission type of the display device. For example, when the second electrode 230 may include a metal, a metal alloy, a metal nitride, a metal fluoride, a conductive metal oxide or a combination thereof.

For example, the second electrode 230 may extend continuously across a plurality of pixels in the display area DA. In an exemplary embodiment, a capping layer and a blocking layer may be formed on the second electrode 230.

Thereafter, as illustrated in FIGS. 3 and 4, an encapsulation layer 300 may be formed on the organic light-emitting diode 200. The encapsulation layer 300 may have a stacked structure of the first inorganic thin film 310 and the second inorganic thin film 330 and an organic thin film 320. For example, the organic thin film 320 may include a cured polymer resin such as poly(meth)acrylate or the like. For example, the cured polymer resin may be formed by cross-linking reaction of monomers. In the peripheral area PA, over-flowing of the organic thin film 320 may be controlled by the dam structure DM.

For example, the inorganic thin films 310 and 330 may include silicon oxide, silicon nitride, silicon carbide, aluminum oxide, tantalum oxide, hafnium oxide, zirconium oxide, titanium oxide or the like.

As explained on the above, organic layers except for the dam structure DM are removed in the organic layer-removed area OA. Thus, the first inorganic thin film 310 of the encapsulation layer 300 may contact the fourth insulation layer 160.

In an exemplary embodiment, the organic light-emitting display device may have a front-emission type in which a light exits through the second electrode 230. However, exemplary embodiment are not limited thereto. For example, the organic light-emitting display device may have a rear-emission type in which a light exits in an opposing direction.

In an exemplary embodiment, the organic light-emitting display device includes an oxide-based semiconductor element and a silicon-based semiconductor element. In an exemplary embodiment, the silicon-based semiconductor element may function as a driving transistor providing current to the organic light-emitting diode 200.

In an exemplary embodiment, the silicon-based semiconductor element may include the first active pattern AP1, the first gate electrode GE1, the first source electrode SE1 and the first drain electrode DE1.

In an exemplary embodiment, the oxide-based semiconductor element may function as a switching transistor to control the driving transistor. For example, the drain electrode of the oxide-based semiconductor element may be electrically connected to the gate electrode of the silicon-based semiconductor element.

In an exemplary embodiment, the oxide-based semiconductor element may have a top-gate configuration. For example, the oxide-based semiconductor element may include the second gate electrode GE2, the second active pattern AP2 disposed under the second gate electrode GE2, the second source electrode SE2 and the second drain electrode DE2.

Exemplary embodiments are not limited to the illustrated configuration. For example, a pixel unit of an organic light-emitting display device according to an exemplary embodiment may include at least three transistors.

Furthermore, in another exemplary embodiment, the oxide-based semiconductor element may function as the driving transistor, and the silicon-based semiconductor element may function as the switching transistor.

In exemplary embodiments, a metal layer forming a bridge pattern is not limited to a gate metal layer for forming a gate electrode of an oxide-based semiconductor element. For example, when signal lines are formed from a same layer as the gate electrode of the oxide-based semiconductor element, the bridge pattern may be formed from a same layer as a gate electrode of a silicon-based semiconductor element.

Figure 11:
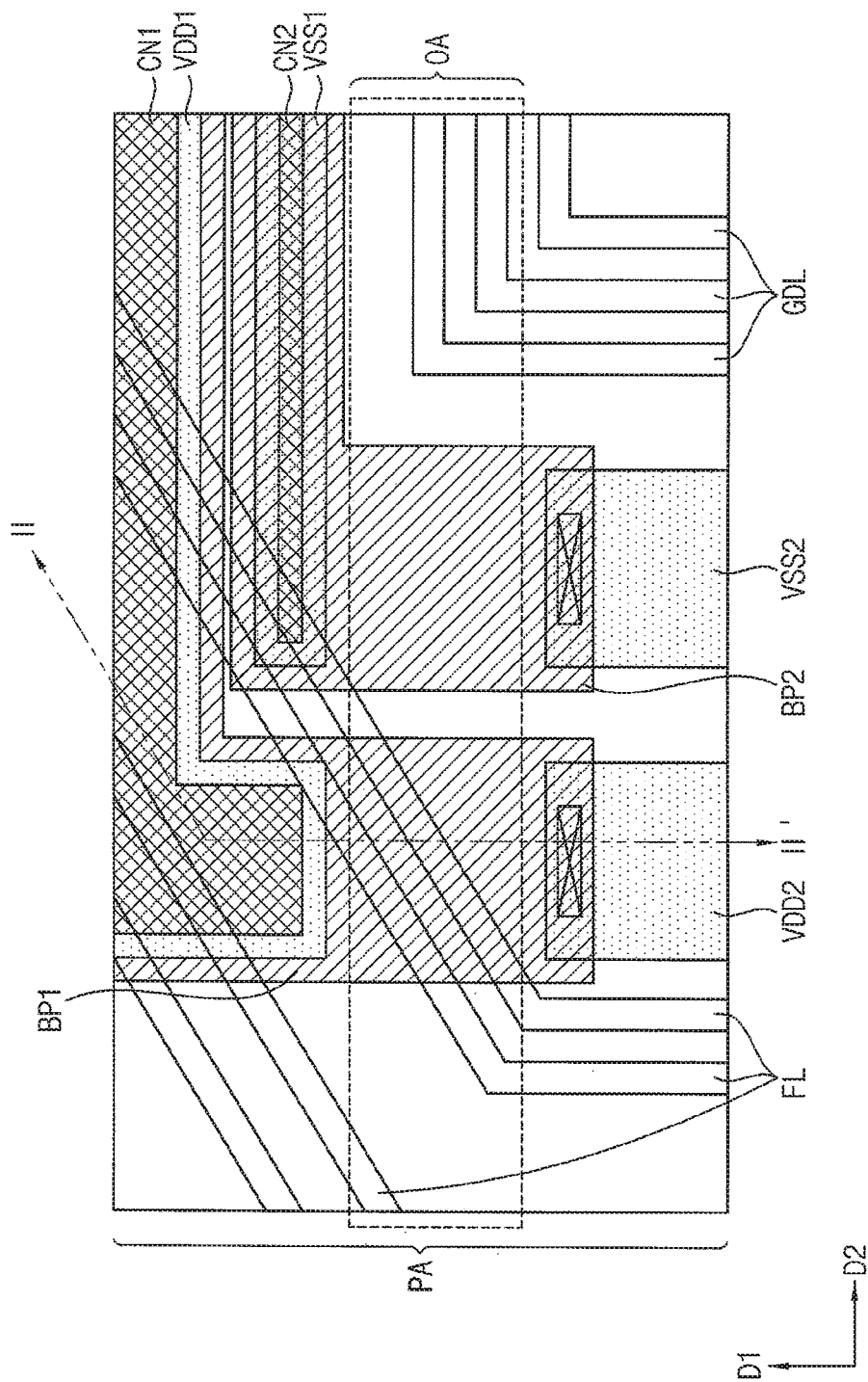
FIG. 11 is an enlarged plan view illustrating a peripheral area of a display device according to an exemplary embodiment.
Figure 12:
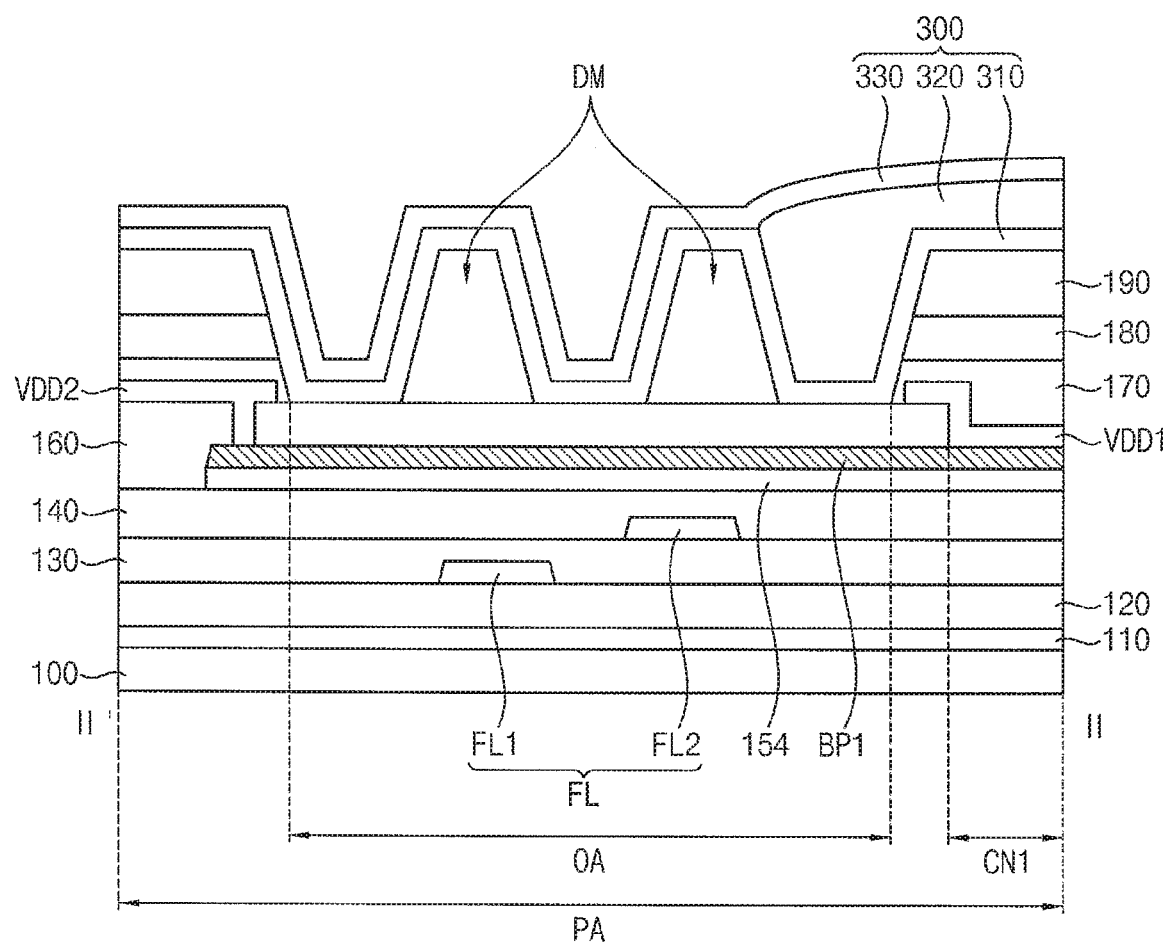
FIG. 12 a cross-sectional view taken along a sectional line II-IF of FIG. 11.

FIG. 11 is an enlarged plan view illustrating a peripheral area of a display device according to an exemplary embodiment. FIG. 12 a cross-sectional view taken along a sectional line II-II' of FIG. 11.

The organic light-emitting display device illustrated in FIGS. 11 and 12 may have a substantially same configuration as the organic light-emitting display device illustrated in FIGS. 3 and 4 except for a shape of a bridge pattern and a shape of a contact area of the bridge pattern and a power wiring. Thus, any duplicated explanation may be omitted.

Referring to FIGS. 11 and 12, a power wiring and a fan-out wiring FL may be disposed in a peripheral area PA.

The power wiring and the fan-out wiring FL may partially overlap an organic layer-removed area OA. A dam structure DM may be disposed in the organic layer-removed area OA.

In an exemplary embodiment, the power wiring may include a first power wiring and a second power wiring. In an exemplary embodiment, the first power wiring may include a first power wiring pattern VDD1 and a second power wiring pattern VDD2, which are spaced apart from each other along a first direction D1 and are electrically connected to each other through a first bridge pattern BP1. The second power wiring may include a third power wiring pattern VSS1 and a fourth power wiring pattern VSS2, which are spaced apart from each other along the first direction D1 and are electrically connected to each other through a first bridge pattern BP2.

In an exemplary embodiment, the organic layer-removed area OA may extend along a second direction D2 crossing the first direction D1, and may overlap the first and second bridge patterns BP1 and BP2.

The fan-out wiring FL may include a first fan-out line FL1 and a second fan-out line FL2, which are disposed in different layers.

In an exemplary embodiment, the first and second bridge patterns BP1 and BP2 may have a shape extending along the power wiring. For example, the first bridge pattern BP1 may extend along the first power wiring in the second direction D2 in the peripheral area PA. The second bridge pattern BP2 may extend along the second power wiring in the second direction D2 in the peripheral area PA, or may have a shape surrounding the display area DA.

In an exemplary embodiment, contact areas of the bridge patterns BP1 and BP2 and the power wiring patterns may extend along an area where the bridge patterns BP1 and BP2 and the power wiring patterns overlap each other. For example, a contact area CN1 of the first bridge pattern BP1 and the first power wiring pattern VDD1 may extend along the first power wiring in the second direction D2 in the peripheral area PA. A contact area CN2 of the second bridge pattern BP2 and the third power wiring pattern VSS1 may extend along the second power wiring in the second direction D2 in the peripheral area PA, or may have a shape surrounding the display area DA.

Thus, a power may be transferred to a pixel array in the display area through a dual wiring of the bridge pattern and the power wiring pattern. As an entire resistance of the power wiring is reduced, a power consumption of the display device may be reduced, and a driving efficiency may be improved.

According to exemplary embodiments, a power wiring is extended through a bridge pattern in an organic layer-removed area. Thus, as a signal wiring and a power wiring overlap each other, a width of a non-display area may be reduced.

Furthermore, the bridge pattern may be extended so that the power line may have a dual wiring structure. Thus, an electrical resistance of the power line may be reduced.

Exemplary embodiments may be applied to various display devices. For example, exemplary embodiment may be applied to vehicle-display device, a ship-display device, an aircraft-display device, portable communication devices, display devices for display or for information transfer, a medical-display device, etc.

According to exemplary embodiments, a power line of a display device is extended by a bridge pattern in an organic layer-removed area. The bridge pattern may be formed from a second gate electrode disposed in a display area. Thus, the bridge pattern may be protected by an inorganic insulation layer even if organic insulation layers on the bridge pattern are removed in the organic layer-removed area. Thus, generation of a crack of the inorganic layer in the organic layer-removed area may be prevented or reduced.

Furthermore, the bridge pattern may be extended so that the power line may have a dual wiring structure. Thus, an electrical resistance of the power line may be reduced, and reliability of the display device may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
 a first transistor disposed in a display area including an array of pixel areas, the first transistor comprising a first active pattern and a first gate electrode;
 a second transistor electrically connected to the first transistor, the second transistor comprising a second active pattern and a second gate electrode;
 a light-emitting element electrically connected to at least one of the first transistor and the second transistor;
 a power wiring disposed in a peripheral area surrounding the display area, the power wiring comprising:
  a first power wiring pattern;
  a second power wiring pattern spaced apart from the first power wiring pattern; and
  a bridge pattern connecting the first power wiring pattern and the second power wiring pattern;
 a signal wiring disposed in the peripheral area; and an insulating layer disposed covering the power wiring and the signal wiring, the insulating layer comprising an organic layer-removed area in which at least a part of the insulating layer is removed, the organic layer-removed area extending in a direction to cross the power wiring in a plan view,
wherein the bridge pattern overlapping the organic layer-removed area,
wherein the power wiring and the signal wiring overlap each other in the organic layer-removed area,
wherein the signal wiring is disposed in a same layer as the first gate electrode, and the bridge pattern is disposed in a same layer as the second gate electrode.

2. The display device of claim 1, further comprising: a gate wiring pattern disposed on the first gate electrode.

3. The display device of claim 2, further comprising:
a first insulation layer covering the first active pattern;
a second insulation layer covering the first gate electrode;
a third insulation layer covering the gate wiring pattern;
a fourth insulation layer covering the second gate electrode and the bridge pattern; and
a first source metal pattern disposed on the fourth insulation layer and including a source electrode and a drain electrode,
wherein the insulating layer comprises:
a fifth insulation layer covering the first source metal pattern; and
a pixel-defining layer disposed on the fifth insulation layer.

4. The display device of claim 3, further comprising: a dam structure disposed in the organic layer-removed area.

5. The display device of claim 1, further comprising an encapsulation layer covering the light-emitting element.

6. The display device of claim 3, further comprising:
a gate insulation pattern disposed between the second active pattern and the second gate electrode; and
a dummy insulation pattern disposed between the bridge pattern and the third insulation layer.

7. The display device of claim 2, wherein the signal wiring comprises a first fan-out line disposed in a same layer as the first gate electrode and a second fan-out line disposed in a same layer as the gate wiring pattern.

8. The display device of claim 1, wherein the power wiring is configured to transfer a power to the light-emitting element.

9. The display device of claim 8, wherein the power wiring comprises:
a first power wiring configured to transfer a first power voltage to the light-emitting element; and
a second power wiring configured to transfer a second power voltage to the light-emitting element.

10. The display device of claim 1, wherein the signal wiring is configured to transfer a data signal to at least one of the first transistor and the second transistor.

11. The display device of claim 1, wherein the first active pattern comprises silicon, and
wherein the second active pattern comprises oxide semiconductor.

12. The display device of claim 1, wherein a contact area of the bridge pattern and the first power wiring pattern extends along the first power wiring pattern.

* * * * *